US012633489B2

(12) United States Patent (10) Patent No.: US 12,633,489 B2
Kruit (45) Date of Patent: May 19, 2026

(54) ELECTRON BEAM APPARATUS, FOIL OR GRID LENS, AND METHOD OF OPERATING AN ELECTRON BEAM APPARATUS

(71) Applicant: ICT Integrated Circuit Testing Gesellschaft für Halbleiterprüftechnik mbH, Heimstetten (DE)

(72) Inventor: Pieter Kruit, Delft (NL)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 324 days.

(21) Appl. No.: 18/243,219

(22) Filed: Sep. 7, 2023

(65) Prior Publication Data
US 2025/0087442 A1 Mar. 13, 2025

(51) Int. Cl.
*H01J 37/14* (2006.01)
*H01J 37/05* (2006.01)
*H01J 37/153* (2006.01)
*H01J 37/244* (2006.01)

(52) U.S. Cl.
CPC .............. *H01J 37/14* (2013.01); *H01J 37/05* (2013.01); *H01J 37/153* (2013.01); *H01J 37/244* (2013.01); *H01J 2237/1534* (2013.01)

(58) Field of Classification Search
CPC .......... H01J 37/14; H01J 37/05; H01J 37/153; H01J 37/244; H01J 2237/1534; H01J 2237/103; H01J 2237/1215; H01J 2237/2801; H01J 37/12
See application file for complete search history.

(56) References Cited

U.S. PATENT DOCUMENTS

| | | | | |
|---|---|---|---|---|
| 4,442,355 A * | 4/1984 | Tamura | ................. | H01J 37/261 |
| | | | | 250/397 |
| 4,728,790 A * | 3/1988 | Plies | ..................... | H01J 37/268 |
| | | | | 250/305 |
| 4,769,543 A * | 9/1988 | Plies | ..................... | H01J 49/488 |
| | | | | 250/305 |
| 4,808,821 A * | 2/1989 | Feuerbaum | ......... | H01J 37/1474 |
| | | | | 250/397 |
| 4,812,651 A * | 3/1989 | Feuerbaum | ........... | H01J 37/268 |
| | | | | 250/397 |
| 4,831,267 A * | 5/1989 | Brunner | ................. | H01J 37/244 |
| | | | | 250/397 |
| 4,912,405 A * | 3/1990 | Richardson | .......... | G01R 31/305 |
| | | | | 324/754.22 |
| 4,983,830 A * | 1/1991 | Iwasaki | ................. | G01R 31/302 |
| | | | | 250/306 |

(Continued)

*Primary Examiner* — David A Vanore

(74) *Attorney, Agent, or Firm* — Kilpatrick Townsend & Stockton LLP

(57) ABSTRACT

An electron beam apparatus (100) is described, including an electron source (105) configured to generate a primary electron beam propagating along an optical axis (A), a sample stage (108) configured to support a sample, an objective lens (120) configured to focus the primary electron beam on the sample for causing an emission of a signal electron beam and a foil or grid lens (300, 400) for influencing the signal electron beam. The foil or grid lens includes an electrode (340) that surrounds the optical axis; and a first foil or grid (320) adjacent to the electrode and perpendicular to the optical axis, the first foil or grid being substantially transparent to electrons, wherein a central opening (325) configured to allow the primary electron beam to pass through the central opening is provided in the first foil or grid.

19 Claims, 6 Drawing Sheets

(56)  References Cited

U.S. PATENT DOCUMENTS

| | | | | | |
|---|---|---|---|---|---|
| 5,517,028 | A * | 5/1996 | Ito | H01J 37/268 | |
| | | | | 250/305 | |
| 6,333,508 | B1 * | 12/2001 | Katsap | B82Y 40/00 | |
| | | | | 313/310 | |
| 6,407,387 | B1 * | 6/2002 | Frosien | H01J 37/28 | |
| | | | | 250/397 | |
| 6,528,799 | B1 * | 3/2003 | Katsap | B82Y 40/00 | |
| | | | | 250/492.23 | |
| 6,664,544 | B1 * | 12/2003 | Marui | H01J 37/141 | |
| | | | | 250/396 ML | |
| 2001/0025929 | A1 * | 10/2001 | Nakasuji | H01J 37/244 | |
| | | | | 250/399 | |
| 2003/0010934 | A1 * | 1/2003 | Katsap | H01J 37/065 | |
| | | | | 250/492.1 | |
| 2004/0004773 | A1 * | 1/2004 | Khursheed | H01J 37/153 | |
| | | | | 359/800 | |
| 2004/0149925 | A1 * | 8/2004 | Muller | H01J 37/3174 | |
| | | | | 250/396 R | |
| 2008/0135748 | A1 * | 6/2008 | Daimon | H01J 37/244 | |
| | | | | 250/311 | |
| 2009/0302217 | A1 * | 12/2009 | Wagner | H01J 37/26 | |
| | | | | 250/311 | |
| 2010/0001202 | A1 * | 1/2010 | Matsuda | H01J 37/12 | |
| | | | | 250/311 | |
| 2013/0043388 | A1 * | 2/2013 | Hatano | H01J 37/244 | |
| | | | | 250/310 | |
| 2013/0126730 | A1 * | 5/2013 | Khursheed | H01J 49/48 | |
| | | | | 250/311 | |
| 2013/0273478 | A1 * | 10/2013 | Sano | H01J 3/12 | |
| | | | | 430/325 | |
| 2023/0112447 | A1 * | 4/2023 | Ren | H01J 37/1472 | |
| | | | | 250/307 | |
| 2025/0087442 | A1 * | 3/2025 | Kruit | H01J 37/244 | |
| 2025/0299906 | A1 * | 9/2025 | Kruit | H01J 37/147 | |

* cited by examiner

ELECTRON BEAM APPARATUS, FOIL OR GRID LENS, AND METHOD OF OPERATING AN ELECTRON BEAM APPARATUS

TECHNICAL FIELD

Embodiments described herein relate to apparatuses and methods for directing an electron beam on a sample and detecting a signal electron beam emitted from the sample. Specifically, embodiments of the present disclosure relate to an electron beam apparatus with a foil or grid lens for influencing a signal electron beam. Further embodiments relate to a foil lens or a grid lens for influencing an electron beam propagating through the foil lens or grid lens along an optical axis. Further embodiments relate to a method of operating an electron beam apparatus having a foil lens or grid lens.

BACKGROUND

Modern semiconductor technology has created a high demand for structuring and probing specimens in the nanometer or even in the sub-nanometer scale. Micrometer and nanometer-scale process control, inspection or structuring, is often done with charged particle beams, e.g. electron beams, which are generated, shaped, deflected and focused in charged particle beam systems, such as electron microscopes or electron beam pattern generators. For inspection purposes, charged particle beams offer a superior spatial resolution compared to, e.g., photon beams.

Apparatuses using charged particle beams, such as scanning electron microscopes (SEM), have many functions in a plurality of industrial fields, including, but not limited to, inspection of electronic circuits, exposure systems for lithography, detecting systems, defect inspection tools, and testing systems for integrated circuits. In such particle beam systems, fine beam probes with a high current density can be used. For instance, in the case of an SEM, the primary electron beam generates signal electrons like secondary electrons (SE) and/or backscattered electrons (BSE) when impinging on a sample that can be used to image and/or inspect the sample.

In a typical scanning electron microscope (SEM), the primary electron beam is focused by an objective lens onto the sample, and at least some of the signal electrons emitted from the sample propagate back through the objective lens toward one or more electron detectors. The objective lens, having a "focusing effect" on electrons, may reduce a divergence of the signal electron beam when propagating back through the objective lens toward the detector.

The emission angles and the electron energies of BSEs may contain important information about the sample and, therefore, a detection of the BSEs in a scanning electron microscope with a high detection efficiency is beneficial. However, a wide angular spread of the BSEs emitted from the sample makes a reliable detection of the BSEs difficult. Electron lenses used to focus or collimate a highly divergent signal beam may cause chromatic and/or spherical aberrations, may lead to a divergent signal electron beam which is difficult to detect, and may negatively influence also the primary electron beam.

In view of the above, improved apparatuses and methods that enable a reliable detection of the signal electron beam, particularly of BSEs generated at a high angular spread, would be beneficial. Embodiments of the present disclosure aim at providing an electron beam apparatus, foil or grid lenses, and methods of operating an electron beam apparatus that overcome at least some of the problems mentioned above.

SUMMARY

In light of the above, an electron beam apparatus, a foil or grid lens for influencing an electron beam, and a method of operating an electron beam apparatus having a foil or grid lens are provided according to the independent claims.

According to an aspect of the disclosure, an electron beam apparatus is provided. The electron beam apparatus includes an electron source configured to generate a primary electron beam propagating along an optical axis, a sample stage configured to support a sample, an objective lens configured to focus the primary electron beam on the sample for causing an emission of a signal electron beam, and a foil or grid lens for influencing the signal electron beam. The foil or grid lens includes an electrode that surrounds the optical axis; and a first foil or grid adjacent to the electrode and perpendicular to the optical axis, the first foil or grid being substantially transparent to electrons. A central opening configured to allow the primary electron beam to pass through the central opening is provided in the first foil or grid. The first foil or grid surrounds the central opening.

According to an aspect of the disclosure, a foil or grid lens for influencing an electron beam propagating through the foil or grid lens along an optical axis is provided. The foil or grid lens includes an electrode that surrounds the optical axis; and a first foil or grid adjacent to the electrode and perpendicular to the optical axis, the first foil or grid being substantially transparent to electrons. A central opening with a diameter of 100 μm or more is provided in the first foil or grid.

In particular, the central opening may be sized such that a primary electron beam can pass therethrough, particularly without being substantially influenced by the foil or grid lens. Off-axial signal electrons of the signal electron beam can penetrate through the foil or grid that surrounds the central opening for being influenced by the foil or grid lens, particularly for compensating aberrations of the signal electron beam.

According to an aspect of the disclosure, a method of operating an electron beam apparatus having a foil or grid lens is provided, the foil or grid lens having a first foil or grid arranged adjacent to an electrode. The method includes applying an electrical potential between the first foil or grid and the electrode, directing a primary electron beam along an optical axis through a central opening provided in the first foil or grid, and focusing, using an objective lens, the primary electron beam on a sample for causing emission of a signal electron beam that propagates through the objective lens and through the foil or grid lens in an opposite direction as compared to the primary electron beam. Off-axial electrons of the signal electron beam propagate through the first foil or grid that surrounds the central opening and is substantially transparent to electrons.

The signal electron beam passing through the foil or grid lens may be influenced, while the primary electron beam passing through the central opening is not substantially affected. In particular, spherical and/or chromatic aberration of the signal electron beam may be corrected by the grid or foil lens. Alternatively or additionally, a divergence or a convergence of the signal electron beam may be modified by the grid or foil lens, in particular such that an essentially collimated signal electron beam is provided downstream of the grid or foil lens.

Further advantages, features, aspects and details that can be combined with embodiments described herein are evident from the dependent claims, the description and the drawings.

BRIEF DESCRIPTION OF THE DRAWINGS

So that the manner in which the above recited features of the present disclosure can be understood in detail, a more particular description, briefly summarized above, may be had by reference to embodiments. The accompanying drawings relate to one or more embodiments and are described in the following.

DETAILED DESCRIPTION

Figure 1:
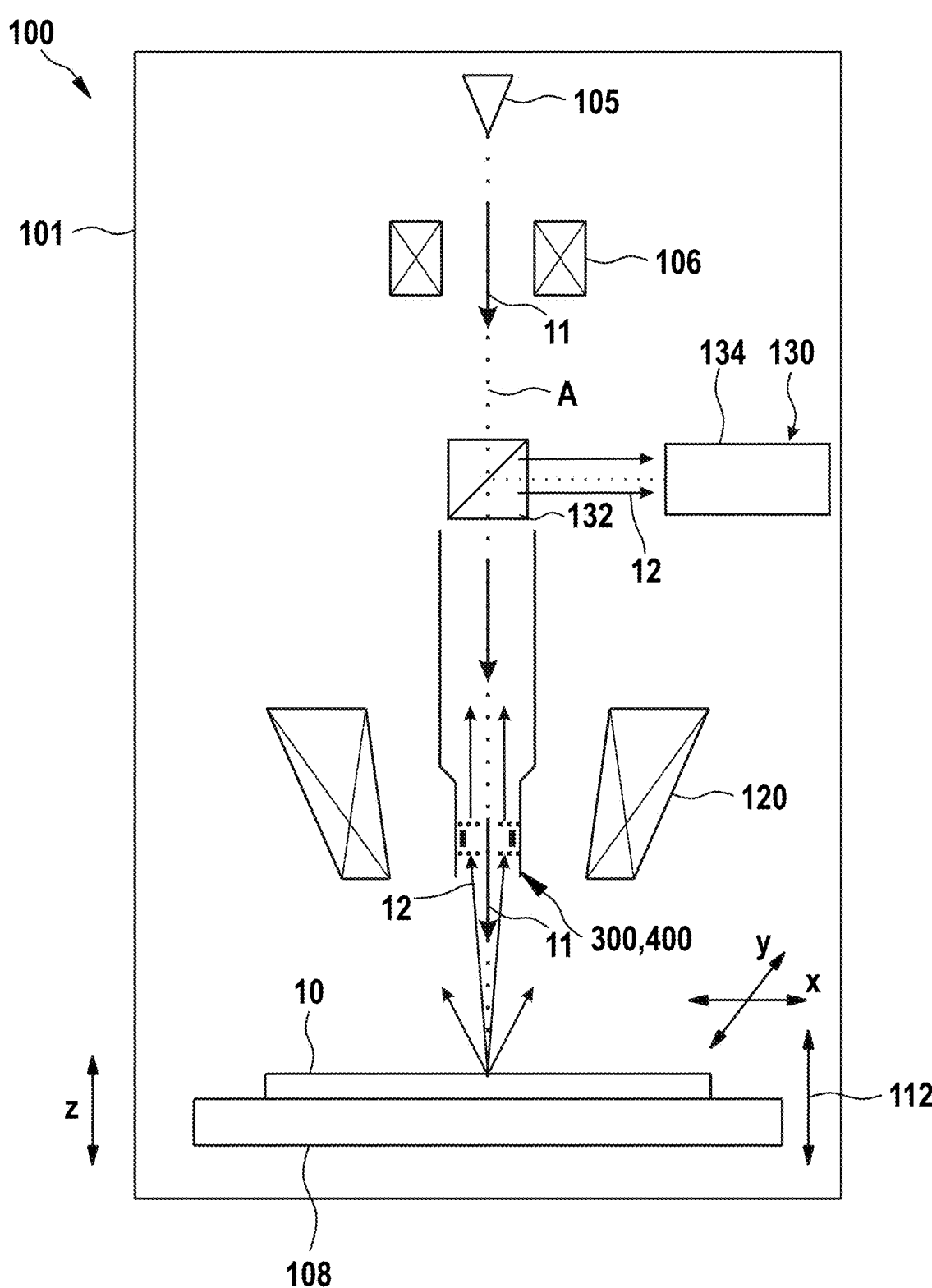
FIG. 1 shows a schematic view of an electron beam apparatus according to embodiments described herein.

Reference will now be made in detail to the various embodiments, one or more examples of which are illustrated in the figures. Within the following description of the drawings, same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

As used herein, signal electrons emitted from a sample can include secondary electrons (SEs) and/or backscattered electrons (BSEs). Secondary electrons are emitted from within a surface of a sample upon impingement of a primary electron beam on the sample. Backscattered electrons are electrons of the primary electron beam which are backscattered from the sample. Backscattered electrons generally have a higher energy compared to secondary electrons. A signal electron beam including BSEs may have a large energy spread and/or a large angular spread when leaving the sample, and it may, therefore, be difficult to steer the signal electron beam back through the objective lens to a detector device. Backscattered electrons can, for example, have a particle energy above 50 eV, e.g., keV or more, or 10 keV or more, and secondary electrons can have a particle energy below 50 eV. "Off-axial" signal electrons are emitted from the sample at an angle relative to the optical axis, e.g., in an angular range from 5° to 90°. "Axial" signal electrons are emitted from the sample essentially along the optical axis, e.g., at an angle below 5°.

As used herein, the term "signal electron beam" refers to a beam of secondary electrons and/or backscattered electrons, particularly a beam of backscattered electrons. A signal electron beam is emitted from the sample upon impingement of the primary electron beam. The signal electron beam can comprise backscattered and/or secondary electrons which are emitted from the sample, e.g. along the optical axis (A) or at an angle with respect to the optical axis, e.g., in an angular range from 0° to 65° relative to the optical axis.

As used herein, an electron beam that is "influenced" by a foil or grid lens may be modified such that a divergence or convergence angle of the electron beam is modified, for example, for focusing or defocusing the electron beam or for reducing a beam divergence. Alternatively or additionally, aberrations of the electron beam may be corrected, particularly spherical and/or chromatic aberrations, for example, with the aim of providing an essentially parallel or collimated beam. An electron beam that is not substantially influenced by a foil or grid lens substantially maintains the same beam divergence/convergence and the same beam current when propagating through the foil or grid lens. Particularly, if an electron beam remains essentially unmodified when propagating through a foil or grid lens, the foil or grid lens has only a negligible effect on a propagation path, on a divergence/convergence angle and on a beam current of the beam.

A "grid or foil lens" as used herein can refer to a grid lens, i.e., an electron lens in which a potential difference is applied between a grid and an electrode. A "grid or foil lens" can also refer to a foil lens, i.e., an electron lens in which a potential difference is applied between a foil and an electrode. The foil or the grid is respectively permeable for electrons, i.e., (some or most of the) electrons of a spatially distributed electron beam can penetrate through the foil or the grid. If the term "grid lens" is used in the following description, a "foil lens" can generally be alternatively used with a similar effect on the electron beam, and vice versa. Also, a "first grid" and a "second grid" as used herein can generally be replaced with a "first foil" and a "second foil".

A foil lens can be used in an electron beam apparatus for applying a lens effect and/or negative spherical aberrations on an electron beam. In particular, a "first order lens effect" (="defocus") may be applied on an electron beam and a "third order lens effect" (=negative spherical aberrations) may be applied on an electron beam by a foil lens. A foil lens can also negatively affect an electron beam, because at least some of the electrons are typically scattered by the foil of the foil lens and/or because a "micro-lens effect" may be applied on groups of signal electrons due to the size of the grid holes in a grid. In particular, a small-diameter electron beam with a high beam current, such as a primary electron beam, can be negatively affected by scattering when penetrating through a foil.

Electron beam apparatuses can inspect samples by focusing a primary electron beam on a sample, causing an emission of signal electrons from the sample surface and detecting the signal electrons. Signal electrons are emitted from the sample surface and form a signal electron beam that is to be detected. The signal electron beam, particularly a beam of BSEs, may have a large angular spread and/or a large energy spread and may therefore be susceptible to aberrations, particularly to spherical and chromatic aberrations. The primary electron beam may be focused by a magnetic objective lens onto the sample, and the signal electron beam may be accelerated back to the magnetic objective lens, and may be directed through the magnetic objective lens in the opposite direction as compared to the primary electron beam. A detector device for detecting the signal electrons may be arranged on a downstream side of the objective lens in the propagation direction of the signal electron beam ("through the lens detection").

An aberration corrector can be provided to correct aberrations of the signal electron beam. However, typical aberration correctors may also influence the primary electron beam and may negatively affect the inspection process. It would be beneficial to correct aberrations of the signal electron beam while leaving the primary electron beam substantially uninfluenced. The present disclosure provides an electron beam apparatus, a foil or grid lens and a method of operating an electron beam apparatus that can selectively influence the signal electron beam (that typically has a considerably larger angular spread as compared to the primary electron beam), even if the primary electron beam and the signal electron beam run along the same path along the optical axis in opposite directions.

Electron Beam Apparatus

According to an aspect, an electron beam apparatus is provided. The electron beam apparatus includes an electron source configured to generate a primary electron beam propagating along an optical axis, a sample stage configured to support a sample, an objective lens configured to focus the primary electron beam on the sample for causing an emission of a signal electron beam, and a foil or grid lens for influencing the signal electron beam. The foil or grid lens includes an electrode that surrounds the optical axis, and a first foil or grid adjacent to the electrode and perpendicular to the optical axis. The first foil or grid is permeable by electrons. A central opening configured to allow the primary electron beam to pass through the central opening is provided in the first foil or grid, such that the central opening is surrounded by the first foil or grid.

FIG. 1 is a schematic view of an electron beam apparatus 100 for inspecting and/or imaging a sample 10 according to embodiments described herein, wherein the electron beam apparatus 100 includes a grid or foil lens 300, 400 for influencing a signal electron beam 12.

The electron beam apparatus 100 includes an electron source 105. The electron source is configured to emit an electron beam, also referred to herein as a primary electron beam 11. The primary electron beam 11 propagates along an optical axis A. The electron beam apparatus 100 further includes a sample stage 108 and an objective lens 120. The sample can be placed on the sample stage 108. The objective lens may be a magnetic lens. The objective lens 120 can focus the primary electron beam 11 on the sample 10.

One or more surface regions of the sample 10 can be inspected and/or imaged with the electron beam apparatus 100. The term "sample" as used herein may relate to a substrate, for example, with one or more layers or features formed thereon, a semiconductor wafer, a glass substrate, a flexible substrate, such as a web substrate, or another sample that is to be inspected. The sample can be inspected for one or more of (1) imaging a surface of the sample, (2) measuring dimensions of one or more features of the sample, e.g. in a lateral direction, i.e. in the X-Y-plane, (3) conducting critical dimension measurements and/or metrology, (4) detecting defects, and/or (5) investigating the quality of the sample.

The sample stage 108 may be a movable stage. In particular, the sample stage 108 may be movable in the Z-direction, i.e. in the direction of the optical axis A, such that the distance between the objective lens 120 and the sample stage 108 can be varied (see arrow 112 in FIG. 1). By moving the sample stage 108 in the Z-direction, the sample 10 can be moved to different "working distances". Further, the sample stage 108 may also be movable in a plane perpendicular to the optical axis A (also referred to herein as the X-Y-plane). By moving the sample stage 108 in the X-Y-plane, a specified surface region of the sample 10 can be moved into an area, e.g. a field of view (FOV), below the objective lens 120, such that the specified surface region can be imaged by focusing the primary electron beam 11 thereon. A condenser lens system 106 may be arranged downstream of the electron source 105 with respect to the propagation direction of the primary electron beam. The condenser lens system 106 can collimate the primary electron beam 11 propagating toward the objective lens 120.

The primary electron beam 11 may be focused by the objective lens 120 on the sample 10, and signal electrons from the sample can be accelerated from the sample back through the objective lens. A divergence of the signal electrons passing through the objective lens may be reduced by the objective lens 120, and a signal electron beam 12 to be detected can be formed.

A detector unit 130 may be arranged downstream of the objective lens 120 with respect to the propagation direction of the signal electron beam 12. Signal electrons of the signal electron beam 12 can be detected with the detector unit 130.

The foil or grid lens 300, 400 may be provided along the beam path of the signal electron beam 12, particularly in the vicinity of the objective lens 120, and may be configured to selectively influence the signal electron beam 12. In particular, the objective lens may be a magnetic lens, and the foil or grid lens may be arranged in the vicinity of a magnetic lens gap of the magnetic lens, e.g. directly downstream of the magnetic gap in the propagation direction of the signal electron beam, as it is schematically depicted in FIG. 1 (and in FIG. 2b). A position of the foil or grid lens near the objective lens allows a correction of aberrations caused by the objective lens directly following the generation of said aberrations. Spherical aberrations may have a focusing effect on electrons with a focusing strength dependent on the distance from the optical axis. If the aberrations are corrected directly after the generation of the aberrations, an increased divergence of the electron beam due to the aberrations can be reduced or avoided.

In particular, the foil or grid lens may be configured to compensate at least one of spherical and chromatic aberrations of the signal electron beam caused by the objective lens upon propagation of the signal electron beam through the objective lens.

In some embodiments, the signal electron beam 12 is separated from the primary electron beam 11 with a beam separator 132, and the signal electron beam 12 is directed toward a detector unit 130. The detector unit 130 can include or be an energy analyzer 134. The beam separator 132 may be placed in a propagation path of the primary electron beam 11 and the signal electron beam 12 along the optical axis A. In some embodiments, after passing through the beam separator 132, the signal electron beam 12 may have a propagation path substantially perpendicular to the propagation path before passing through the beam separator. After passing through the beam separator 132, the signal electron beam may have a propagation path substantially perpendicular to the optical axis A.

The beam separator 132 may alter the propagation path of the signal electron beam such that the signal electron beam propagates towards the detector unit 130. The detector unit, which may be an energy analyzer, may be configured to detect and/or analyze the signal electron beam. Alternatively or additionally, a spectrometer may be provided for high resolution detection of backscattered electrons of the signal electron beam and/or for Auger electron energy analysis. In some embodiments, a beam separator for separating the signal electron beam from the primary electron beam and an energy analyzer for analyzing the signal electron beam are provided.

In some embodiments, the primary electron beam 11 is decelerated between the objective lens and the sample, e.g., by a retarding field device (not shown in the figures). For example, a deceleration potential can be provided with an electrode arranged downstream of the objective lens in the propagation direction of the primary electron beam. The retarding field can accelerate the signal electrons starting from the sample toward the objective lens.

The beam-optical components of the electron beam apparatus 100 can be placed in a vacuum chamber 101 that can be evacuated. A vacuum can be beneficial for propagation of the electron beam, for example, along the optical axis A from the electron source 105 toward the sample stage 108. The electron beam may hit the sample 10 under a sub-atmospheric pressure, e.g. a pressure below $10^{-3}$ mbar or a pressure below $10^{-5}$ mbar.

The objective lens 120 is configured to focus the primary electron beam on the sample for causing an emission of a signal electron beam. The objective lens can be, for example, a magnetic lens, an electrostatic lens, or a combined magnetic-electrostatic lens. For example, the objective lens may be a magnetic lens and provide a magnetic field to focus the primary electron beam on the sample. The objective lens 120 may be configured for a "through the lens detection" setup.

The primary electron beam and the signal electron beam may have a propagation path that at least partially overlaps along the optical axis A. The primary electron beam may propagate along the optical axis from the electron source 105 to the sample 10. The signal electron beam may propagate along the optical axis from the sample 10 back through the objective lens 120 in a propagation direction 10) opposite to the propagation direction of the primary electron beam.

The objective lens 120 may reduce a divergence of the signal electron beam propagating back through the objective lens. The objective lens 120 may further cause aberrations of the signal electron beam, particularly of off-axial electrons of the signal electron beam, which have a distance from the optical axis. The signal electron beam 12 may have a large angular spread (in particular when including BSEs that are to be detected) and may include a considerable number of BSEs emitted from the samples at various angles relative to the optical axis (also referred to herein as "off-axial" signal electrons). Such off-axial signal electrons can be negatively affected by the objective lens. In particular, positive spherical 20) aberrations of the objective lens 120 typically cause too much convergence of the off-axial signal electrons, which may lead to a crossover of at least some of the signal electrons downstream of the objective lens. Such an effect is schematically depicted in FIG. 2a.

Figure 2A:
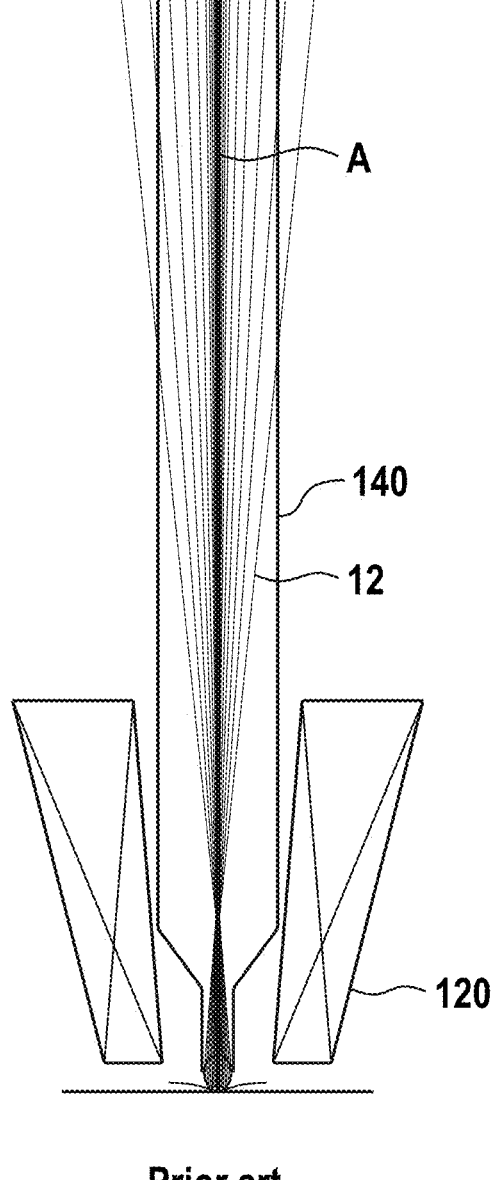
FIG. 2*a* shows a schematic view of a signal electron beam directed back through an objective lens in a conventional apparatus without a foil or grid lens.

FIG. 2a schematically shows a portion of a conventional electron beam apparatus without a grid or foil lens as described herein. Positive spherical aberrations of the objective lens 120 cause a crossover of at least some of the signal electrons and, as a consequence, a signal electron beam 12 that may be highly divergent and may even hit the walls of a funnel 140 that surrounds the optical axis. A reliable and efficient detection of the signal electrons downstream of the funnel 30) 140, e.g., by a detector device or a beam analyzer, may not be possible.

Large angles between the BSEs and the optical axis make it hard to form a well-focused beam that can enter a detector device. Electron lenses used to focus a beam with large angles suffer from large chromatic and spherical aberrations. The unwanted effect is a loss of signal electrons on side walls of the system and an aberrated spot of signal electrons that do not reliably arrive at the detector device, as shown in FIG. 2a.

Figure 2B:
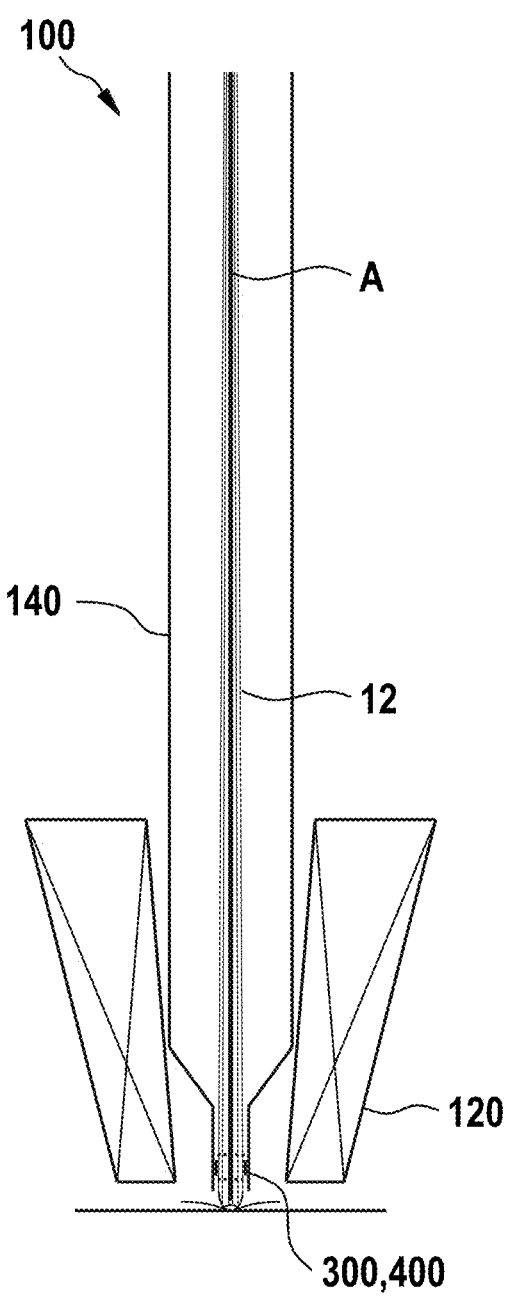
FIG. 2*b* shows a schematic view of a signal electron beam directed through an objective lens, including an aberration correction of the signal electron beam with a foil or grid lens as described herein.

FIG. 2b schematically shows a portion of an electron beam apparatus according to embodiments described herein that includes a foil or grid lens 300, 400. The foil or grid lens 300, 400 may be arranged in the vicinity of the objective lens 120, such that both the primary electron beam and the signal electron beam 12 propagate through the foil or grid lens 300, 400 in opposite directions. The foil or grid lens may be configured to selectively influence the signal electron beam, particularly while maintaining the primary electron beam substantially unmodified and/or undisturbed.

As is schematically depicted in FIG. 2b, the foil or grid lens 300, 400 may be configured to apply negative spherical aberrations on the (off-axial) electrons of the signal electron beam 12 for compensating positive spherical aberrations caused by the objective lens 120. An essentially collimated or parallel signal electron beam can be provided that can be reliably directed toward a detector device. In particular, the foil or grid lens 300, 400 can influence the signal electron beam such as to modify a divergence or a convergence of the signal electron beam and/or to correct aberrations of the signal electron beam, particularly aberrations caused by a magnetic lens. The configuration of the foil or grid lens according to embodiments described herein will be explained in the following in further detail.

Advantageously, the aberration correction provided by the grid lens 300, 400 results in the collimation of the signal electron beam, particularly in that the signal electron beam is provided as a substantially parallel beam. After passing through the objective lens 120 and the foil or grid lens 300, 400, the signal electron beam may be substantially collimated.

Foil or Grid Lens

Figure 3A:
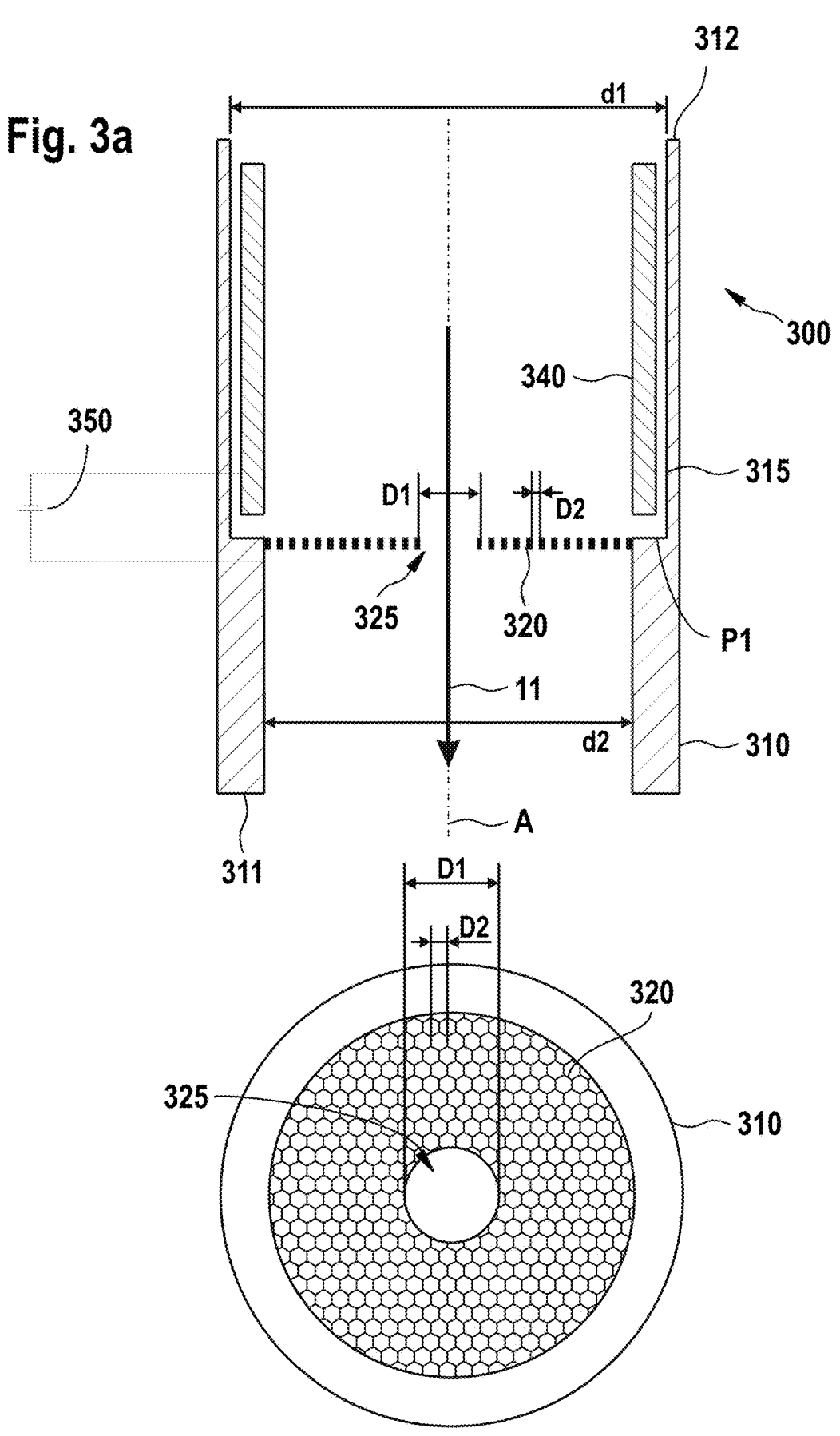
FIG. 3*a* shows a schematic view of a foil or grid lens in a sectional view (upper part) and in a top view (lower part)

FIG. 3a shows a schematic sectional view of a grid lens 300 according to embodiments described herein (upper part) and a schematic top view of the grid lens 300 (lower part). The grid lens 300 includes an electrode 340, e.g., an essentially cylindrical electrode, that surrounds the optical axis A, and a first grid 320 (or, alternatively, a first foil) adjacent to the electrode 340. The first grid 320 extends essentially perpendicular to the optical axis A. In some embodiments, the first grid 320 may be arranged directly adjacent to the electrode 340, i.e., without other beam-optical elements between the first grid and the electrode. In particular, the first grid 320 may be arranged such that a common electric field region for influencing the signal electron beam is generated by the first grid and the electrode (see FIG. 3b), when an electric potential is applied between the first grid and the electrode, e.g., by voltage supply 350.

The first grid 320 (or first foil) is permeable to electrons, which is also referred to herein as being "substantially electron-transparent". In particular, the first grid 320 may provide an electron transparency of 50% or more, particularly 80% or more, more particularly 90% or more. The electron-transparency of the first grid is, however, below 100%, and some of the electrons are scattered or blocked by the grid material. The first grid 320 surrounds a central opening 325, the central opening 325 being configured such as to allow the primary electron beam to pass through the central opening. Specifically, the first grid 320 may have an essentially annular shape and may surround the central opening 325, and the central opening 325 forms a passageway through which the primary electron beam can pass through the foil or grid lens in an unimpeded and unobstructed manner, i.e. without being partially scattered or blocked by the grid material of the first grid that surrounds the central opening.

A foil arranged in the path of an electron beam has an electron transparency of, e.g., 80% or more, if 80% or more of the electrons of the electron beam penetrate the foil without being blocked by the foil material. A grid that has a plurality of small grid holes arranged in the path of an electron beam has an electron transparency of, e.g., 80% or more, if 80% or more of the electrons of the electron beam (having a beam diameter that is significantly larger than one single grid hole) penetrate the grid without being blocked by the grid material. A typical energy range of backscattered electrons of the signal electron beam that penetrates through the grid may be, for example, 1 keV or more and 15 keV or less, e.g., 3 keV or more and 10 keV or less. Some electron scattering may be caused by the material of the grid or foil.

The central opening 325 has a diameter D1 sized to allow the primary electron beam to pass therethrough, particularly a diameter of at least 100 μm. The central opening 325 may be centered with respect to the optical axis A. Accordingly, the primary electron beam propagating along the optical axis can pass through the central opening 325 and does not have to penetrate through the first grid 320 that surrounds the central opening 325. Since the primary electron beam passes through the central opening and not through the grid or foil that surrounds the central opening, the primary electron beam having a high electron density and a small beam diameter is not negatively affected by the foil or grid material (e.g., by the grid wires) of the grid or foil. The central opening 325 may have a diameter larger than typical diameters of primary electron beams, particularly a diameter of at least 100 μm, at least 200 μm, or at least 300 μm. The signal electron beam may have a diameter larger than the central opening, such as above 300 μm, or even above 1 mm, because a beam of backscattered electrons typically has a wide angular spread around the optical axis. In particular, off-axial electrons of the signal electron beam have to penetrate through the grid or foil that annularly surrounds the central opening while axial signal electrons of the signal electron beam may pass through the central opening.

The first foil or grid is made of a conductive material, such as a metal or graphene, such that an electric potential can be applied between the first foil or grid and the electrode to provide the focusing and/or correction effect of a foil or grid lens.

In some embodiments, which can be combined with other embodiments described herein, the first grid 320 is a grid of wires with a plurality of grid holes having a respective maximum hole dimension D2 below 100 μm, particularly below 80 μm, more particularly below 50 μm. The maximum hole dimension D2 of the grid holes is smaller than the diameter D1 of the central opening 325. In some embodiments, the grid wires or grid bars may have a thickness of 2 μm or less, particularly about 1 μm or less than 1 μm for ensuring a high electron transparency.

For example, as is schematically depicted in the lower part of FIG. 3a, the first grid 320 includes a plurality of grid holes, particularly 50 or more grid holes, or 200 or more grid holes. The first grid 320 may have a generally annular shape and may surround the central opening 325, and the central opening may be centrally intersected by the optical axis A and may be round or circular. The area of one grid hole is smaller than the area of the central opening, particularly by a factor of 10 or more, or 20 or more.

In some embodiments, the grid holes have a polygonal shape, e.g., a honeycomb shape, as is schematically depicted in FIG. 3a. The grid is shown to have a hexagonal grid structure. The grid can have other grid structures. The grid can have any suitable polygonal grid structure, such as square, pentagonal, hexagonal or octagonal or any other suitable grid structure. The grid can comprise a plurality of wires, wherein the grid holes are formed between the wires. The grid can be implemented as a micro-electromechanical device (MEMS) and/or may be produced with MEMS manufacturing techniques. The grid may have grid holes having a respective maximum hole dimension D2 between the wires.

The maximum hole dimension D2 can be between 5 μm and 100 μm, particularly between 10 μm and 80 μm, more particularly below 50 μm. The diameter D1 of the central opening 325 is greater than the hole dimension D2 of the grid holes.

In an alternative embodiment, a foil may be provided instead of the grid, wherein the foil may comprise carbon or may be a carbon foil, particularly a graphene foil. The foil may have a thickness of 0.1 μm or less, particularly 0.05 μm or less, which ensures a high electron permeability of, e.g. 50% or more, or 80% or more, and at the same time a high foil stability. The graphene foil can be nanolayer graphene, few-layer graphene or multilayer graphene.

A voltage supply 350 may be provided for applying the potential difference between the electrode 340 and the first grid 320, particularly a potential difference of 2 keV or more, or 5 keV or more. In some embodiments, the first grid 320 is in electric contact with a conductive housing 310 or a funnel of the electron beam apparatus. Accordingly, the first foil or grid can be set on a first electric potential by applying the first electric potential to the conductive housing 310 or funnel.

In some embodiments, the conductive housing 310 may have the shape of a hollow cylinder. The housing may be defined by a first section having a first inner diameter d1 and a second section having a second inner diameter d2. The foil or grid lens 300 may be centered with respect to the optical axis A and may be arranged within the conductive housing. The conductive housing 310 may extend from a first end 311 to a second end 312 in an extended direction parallel to the optical axis A.

The conductive housing may include a recessed portion 315. The recessed portion is a portion recessed in a radial direction, particularly a circularly recessed portion. The recessed portion recesses in the radial direction from an inner wall of a cylinder having the second diameter d2 to an inner wall of a cylinder having the first diameter d1. The recessed portion extends along the extended direction, parallel to the optical axis A. The recessed portion extends along the extended direction from a first position P1 between the first end 311 and the second end 312 partially or fully to the first end or the second end 312. The recessed portion has the first inner diameter d1. The first inner diameter d1 is greater than the second inner diameter d2.

The foil or grid lens 300 comprises the electrode 340. The electrode 340 may be arranged within the recessed portion 315. The electrode 340 may have the shape of a hollow cylinder. The electrode 340 may be a hollow cylindrical electrode. The electrode 340 may be aligned with the optical axis A. The electrode may be concentric with the optical axis A. The electrode 340 may have an inner diameter and an outer diameter. The outer diameter may be such that the electrode 340 can be fitted within the recessed portion 315. The outer diameter of the electrode may be smaller than the first diameter d1. The inner diameter of the electrode may be such that the electrode 340 can be fitted flush with an inner surface of the conductive housing 310 into the recessed portion 315. The inner diameter may be equal to or greater than the second diameter d2. The electrode may be arranged adjacent to the first position P1. The electrode may extend along the extended direction, particularly within the recessed portion 315. The electrode may extend from the first position P1 toward the first end or the second end.

The first grid 320 may be arranged in a plane perpendicular to the optical axis A. The first grid 320 may have a circular perimeter. The central opening configured to allow the primary electron beam to pass through the central opening in an unobstructed manner is provided in the first foil or grid. The central opening may be circular. The first grid 320 may have an annular shape. The inner diameter of the annular shape may be defined by the diameter of the central opening D1. The outer diameter of the annular shape may be defined by the second diameter d2.

Figure 3B:
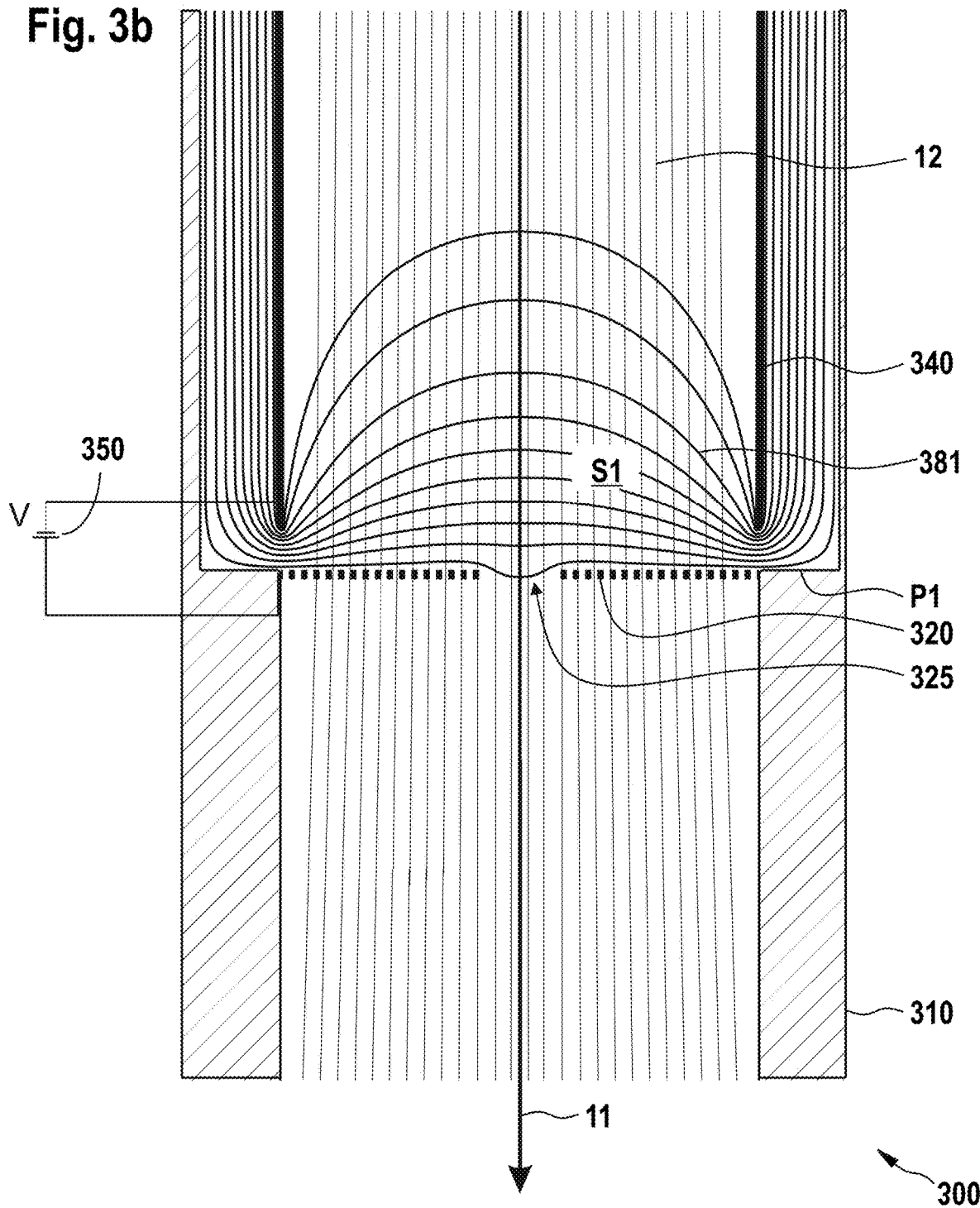
FIG. 3*b* shows a schematic view of a foil or grid lens in operation and a signal electron beam propagating through the foil or grid lens.

FIG. 3*b* shows a schematic view of the foil or grid lens 300 during operation and a signal electron beam 12 propagating through the foil or grid lens. The electric field in an electric field region S1 generated by the potential difference between the electrode 340 and the first grid 320 is illustrated by equipotential lines 381.

As shown in FIG. 3*b*, a voltage supply 350 may be configured to provide a potential difference V between the first grid 320 and the electrode 340. The potential difference V can be applied between the electrode and the first foil or grid. In one embodiment, the voltage supply is configured to apply a potential difference of 2 keV or more, particularly 5 keV or more, between the electrode and the first foil or grid.

A single grid on a potential different from the potential of the electrode forms an electron lens with a negative power and negative spherical and chromatic aberrations. In other words, a convergence of the secondary electron beam can be reduced and positive spherical and chromatic aberrations can be corrected by the electric field depicted in FIG. 3*b* acting on the signal electron beam.

Specifically, a first-order negative lens effect with negative chromatic aberration can compensate positive chromatic aberrations of the signal electron beam, e.g., positive chromatic aberrations caused by the objective lens.

Due to the central opening 326, the on-axis electrons that fly through the central opening are essentially not influenced, which is acceptable because the on-axis electrons and the electrons close to the axis typically do not require a significant correction anyway.

An advantage of a grid with respect to a foil is a typically higher electron transparency and a reduced electron scattering of a grid. For example, a grid can have a high electron transparency above 90%. An advantage of a foil with respect to a grid is reduced blurring of the BSE spot. A grid causes such a blurring due to the size of the grid holes that can be penetrated by the electric field to some extent, even if the grid holes are small.

Figures 4A, 4B:
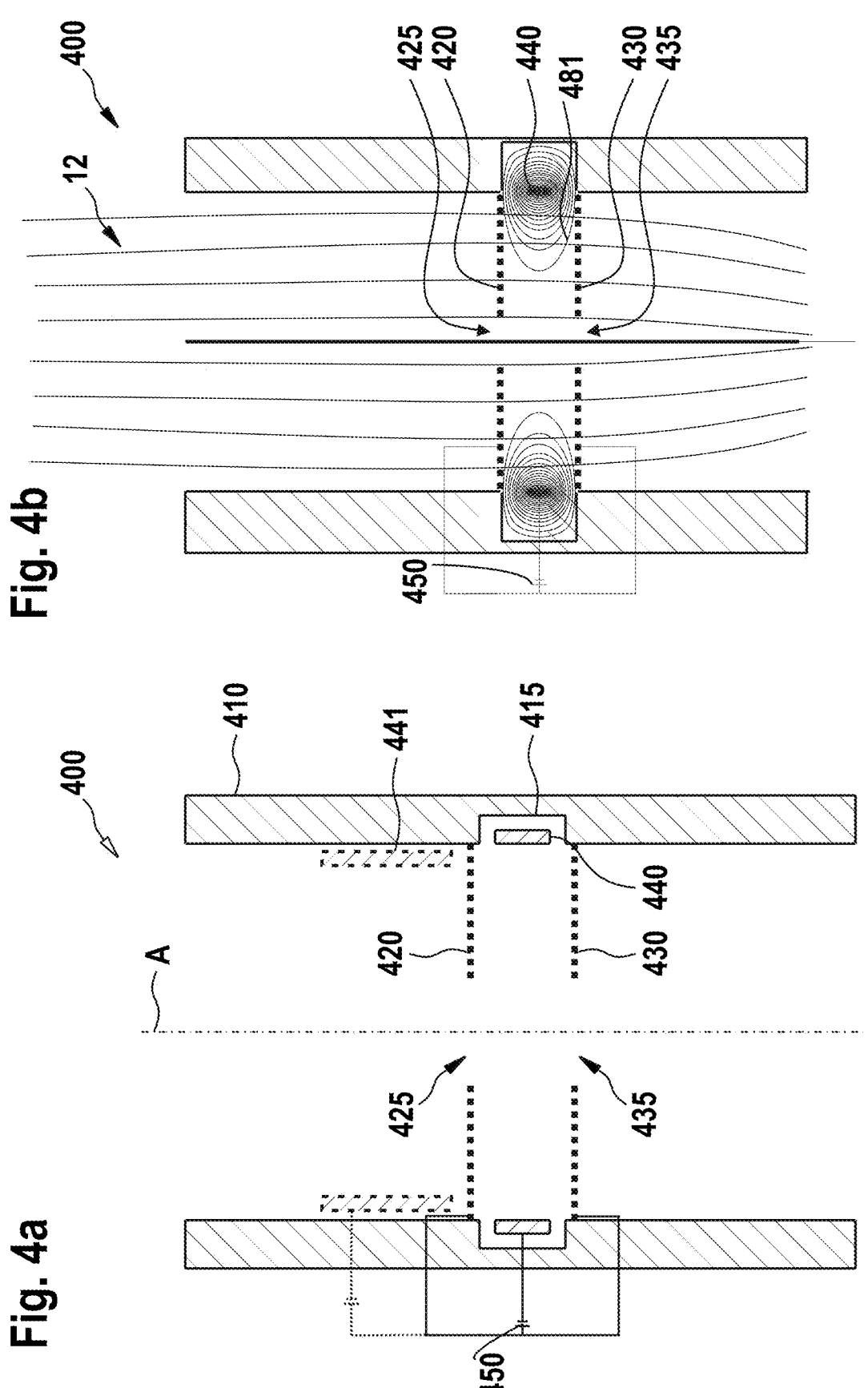
FIG. 4*a* shows a schematic view of another embodiment of a foil or grid lens having a double grid or double foil structure.
FIG. 4*b* shows a schematic view of the foil or grid lens of FIG. 4*a* in operation and a signal electron beam propagating through the foil or grid lens.

FIG. 4*a* is a schematic illustration of a grid lens 400 with a double grid 20) structure according to a second embodiment described herein. The grid lens 400 has a first grid 420 and a second grid 430 (or, alternatively, a first foil and a second foil). The second grid 430 is arranged adjacent to the electrode 440 and perpendicular to the optical axis A. In particular, the electrode 440 is arranged between the grids.

The first grid 420 and the second grid 430 are permeable for electrons and may be configured in accordance with the first grid 320 of the grid lens 300, such that reference can be made to the above explanations, which are not repeated here. In particular, a first central opening 425 is provided in the first grid 420, such that the first central opening is surrounded by the first grid. A second central opening 435 is provided in the second grid, such that the second central opening is surrounded by the second grid. The optical axis A may centrally intersect the central openings, such that the primary electron beam can pass through the central openings without hitting the first and the second grid. A scattering of the primary electron beam by the first grid and by the second grid can be avoided.

The central openings may respectively have a diameter of 100 μm or more, particularly 200 μm or more. In some embodiments, the first central opening 425 and the second central opening 435 may have essentially the same diameter. In some embodiments, the first grid and the second grid may have the same structure and configuration.

Both the first and second grid may be made of a conductive material, such that a potential difference can be applied between the electrode 440 and the first and second grids with a voltage supply 450, e.g., a potential difference of 2 keV or more, particularly 5 keV or more.

The electrode 440 may be arranged between the first grid 420 and the second grid 430, particularly centrally between the grids, e.g., in a symmetric setup. In some embodiments, the electrode 440 may be located in a recessed portion 415 of a conductive housing 410, and the grids may protrude from the conductive housing toward the optical axis A, respectively.

The grid lens 400 may be configured to correct aberrations of the signal electron beam, particularly aberrations of off-axial electrons that penetrate through the first and second grids. More particularly, the grid lens 400 may be configured to apply negative spherical aberrations and/or negative chromatic aberrations on the signal electron beam propagating therethrough. Positive spherical and/or chromatic aberrations caused by the objective lens can be corrected. It may be possible to form an essentially collimated and parallel signal electron beam downstream of the grid lens. The collimated signal electron beam can be more easily directed toward a detector device and can be more efficiently detected, even if the detector device is arranged laterally with respect to the optical axis (see FIG. 1).

A double grid lens, in which the electrode 440 is arranged between the first grid 420 and the second grid 430, as shown in FIG. 4*b*, is suitable for applying negative spherical on an electron beam, particularly without substantially modifying a beam divergence or a beam convergence of the electron beam. In other words, a (third-order) correction effect (particularly, spherical aberration correction) substantially without a (first-order) focusing effect can be applied on the electron beam by a double grid lens. Therefore, the double grid lens of FIG. 4*b* can be used as a spherical aberration corrector for correcting positive spherical aberrations, without substantially changing a beam divergence.

The aberration correction effect of a double grid lens (or double foil lens) with almost zero focusing effect will now be explained with reference to FIG. 4*b*.

FIG. 4*b* shows a schematic view of the grid lens 400 of FIG. 4*a* during operation, and a signal electron beam 12 propagating through the grid lens. The electric field in the electric field region generated by the potential difference between the electrode 440 on the other hand and the first grid 420 and the second grid 430 on the other hand is illustrated by equipotential lines 481.

As can be understood by the electric field lines which are perpendicular to the equipotential surfaces drawn around the central electrode, the (first-order) focusing effects are suppressed by the shielding effect of the two grids, but large negative spherical aberrations are applied on the off-axial electrons penetrating through the two grids. Therefore, the double grid lens of FIG. 4a can be used as an aberration corrector for off-axial electrons of an electron beam, which does not affect a beam divergence.

In some embodiments, which can be combined with other embodiments described herein, the grid or foil lens may further include a second electrode 441 (only schematically illustrated in dashed lines in FIG. 4a) on the other side of one of the grids as the electrode 440. Accordingly, the grid or foil lens may include two grids (or foils) and two electrodes in an alternating sequence along the electron path. By adding the second electrode 441, it is possible to add a (focusing) single-grid lens to the (aberration corrector) double-grid lens. The focusing lens comprises a grid adjacent to an electrode, and the aberration corrector lens comprises an electrode arranged between two grids. Such an arrangement enables a separate setting of focusing effect and aberration correction.

According to a further aspect described herein, a foil or grid lens for influencing an electron beam propagating through the foil or grid lens along an optical axis is provided. The foil or grid lens includes an electrode that surrounds the optical axis and a first foil or grid adjacent to the electrode and perpendicular to the optical axis. The first foil or grid is substantially transparent to electrons. A central opening with a diameter of 100 μm or more is provided in the first foil or grid. The first foil or grid may be made of conductive material, such that an electric potential can be applied between the first foil or grid and the electrode.

The central opening is configured to allow a primary electron beam to pass therethrough, and the substantially electron-transparent first foil or grid is configured for a passage of off-axial electrons of a signal electron beam therethrough for influencing the signal electron beam while maintaining the primary electron beam substantially unmodified. In particular, the first foil or grid is configured to be penetrated by the off-axial electrons of the signal electron beam, while the primary electron beam and axial electrons of the signal electron beam propagate through the central opening.

In some embodiments, the foil or grid lens further includes a second foil or grid of conductive material adjacent to the electrode and perpendicular to the optical axis, the second foil or grid being substantially transparent to electrons. A central opening with a diameter of 100 μm or more is provided in the second foil or grid.

In one embodiment, the foil or grid lens is configured to influence an electron beam, such as a signal electron beam, particularly for modifying a divergence or convergence of the electron beam. The foil or grid lens may include a single grid or foil arranged adjacent to an electrode as described herein.

In one embodiment, the foil or grid lens is configured to correct aberrations of an electron beam, particularly by applying negative spherical and/or chromatic aberrations on the electron beam. The foil or grid lens may include a double grid or foil with an electrode arranged between two grids or foils as described herein.

In one embodiment, the foil or grid lens is configured to separately set a (de-) focusing strength and an aberration correction strength of an electron beam. The foil or grid lens may include two foils or grids and two electrodes in an alternating sequence as described herein.

The signal electron beam is influenced by the foil or grid lens. In particular, the divergence of the signal electron beam is modified, particularly reduced, more particularly the signal electron beam is essentially collimated. Particularly, aberrations of the signal electron beam are compensated, more particularly spherical and/or chromatic aberrations of the signal electron beam are reduced.

The foil or grid lens may leave the primary electron beam propagating through the central opening substantially uninfluenced.

It is noted that foil lenses or grid lenses as described herein, having one or two annular foils or grids provided with a central opening for axial electrons to propagate therethrough in an unobstructed manner can also be used for other applications. In particular, axial electrons are hardly affected by the foil or grid lens, while off-axial particles—which typically suffer more strongly from aberrations—can be selectively influenced by foil or grid lenses described herein. Therefore, the foil or grid lens can also be placed at other locations within an electron beam apparatus, not necessarily in the vicinity of the objective lens. Also, the foil or grid lens can be used for influencing electron beams having a large angular spread or a large diameter, e.g., large-diameter primary electron beams, and it is not necessary that a signal electron beam is directed in an opposite direction through the foil or grid lens. For example, the foil or grid lens described herein can be used for selectively influencing a radially outer beam portion of an electron beam without influencing axial electrons.

Method of Operating an Electron Beam Apparatus

Figure 5:
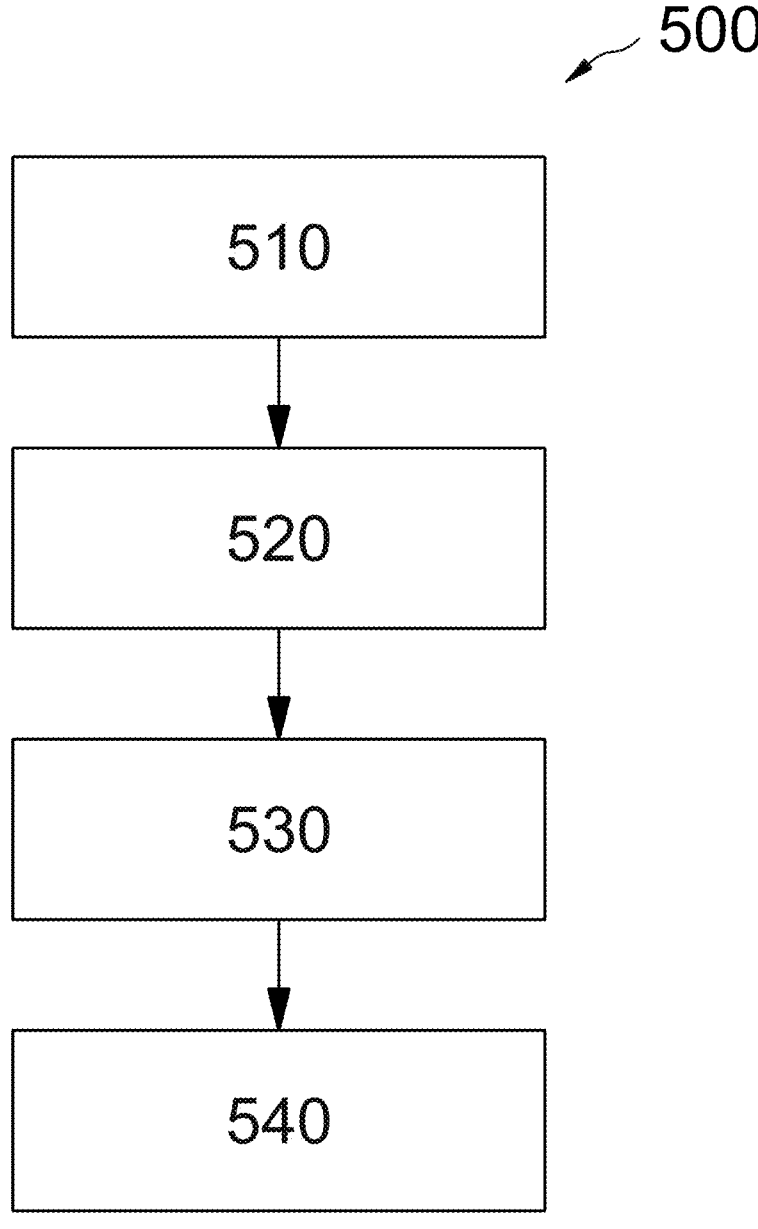
FIG. 5 shows a flow diagram illustrating a method of operating an electron beam apparatus having a foil or grid lens.

FIG. 5 is a block diagram illustrating a method 500 of operating an electron beam apparatus having a foil or grid lens, the foil or grid lens having a first foil or grid arranged adjacent to an electrode.

In block 510, an electrical potential is provided between the first foil or grid element and the electrode. The potential difference may be provided by a voltage supply and may be 2 keV or more, particularly 5 keV or more.

In block 520, a primary electron beam is directed along an optical axis through a central opening provided in the first foil or grid. The primary electron beam may be generated by an electron source configured to generate a primary electron beam, such as a cold field emitter (CFE) or a thermal field emitter (TFE). The first foil or grid may annularly surround the central opening. The primary electron beam may have a beam diameter smaller than a diameter of the central opening, such that the primary electron beam can be directed through the central opening without hitting the foil or grid that surrounds the central opening. In particular, the primary electron beam may have a beam diameter below 100 μm (at the position of the foil or grid lens), and the central opening may have a diameter of at least 100 μm.

In block 530, the primary beam is focused, using an objective lens, particularly a magnetic lens, on a sample for causing an emission of a signal electron beam from the sample. In block 540, the signal electron beam propagates through the objective lens and through the foil or grid lens in an opposite direction as compared to the primary electron beam. Off-axial electrons of the signal electron beam penetrate through the foil or grid that surrounds the central opening and is permeable to electrons, particularly with an electron permeability of 50% or more, particularly 80% or more, more particularly 90% or more.

The objective lens may be a magnetic lens. The magnetic lens may provide a magnetic field to focus the primary electron beam. The magnetic field of the objective lens may reduce a beam divergence of the signal electron beam that is directed through the objective lens in an opposite direction, causing aberrations of the signal electron beam, particularly spherical aberrations (if the signal electrons have a large angular spread, particularly in case of BSEs) and chromatic aberrations (if the signal electrons have a large energy spread, particularly in case of BSEs). The aberrations may be at least partially compensated by the grid or foil lens described herein.

The primary electron beam is substantially uninfluenced by the foil or grid lens, when propagating through the central opening. In particular, an intensity of the primary electron beam is not reduced by scattering, and a beam divergence or convergence of the primary electron beam is only affected in a negligible manner by the grid or foil lens.

In some embodiments, which can be combined with other embodiments described herein, the foil or grid lens further comprises a second foil or grid, particularly of conductive material, adjacent to the electrode and perpendicular to the optical axis, the first foil or grid and the second foil or grid being arranged on opposite sides of the electrode. The primary beam propagates through a central opening provided in the second foil or grid, and the off-axial electrons of the signal electron beam penetrate through the second foil or grid that surrounds said central opening provided in the second foil or grid.

The second foil or grid and the first foil or grid may have the same structure and configuration, and may be arranged on opposite sides of the electrode, particularly adjacent to the electrode, such that one common electrical field region is generated by the electrode arranged between two grids.

The foil or grid lens may be configured to correct aberrations of the signal electron beam, particularly aberrations caused by the propagation of the signal electron beam through the objective lens. More particularly, the foil or grid lens may be configured to correct positive spherical and/or chromatic aberration caused by the magnetic lens. Negative spherical and/or chromatic aberrations may be applied on the signal electron beam by the foil or grid lens, particularly on off-axial BSEs of the signal electron that penetrate through the first grid and the second grid. The positive spherical and/or chromatic aberrations caused by the objective lens and the negative spherical and/or chromatic aberrations caused by the foil or grid lens may cancel each other out, providing an essentially aberration-free signal electron beam, particularly an essentially collimated or parallel signal electron beam.

In some embodiments, the method includes one or both of correcting at least one of spherical and chromatic aberration of the signal electron beam with the foil or grid lens and modifying a divergence or convergence of the signal electron beam, particularly for providing an essentially parallel signal electron beam.

A foil or grid lens having one single foil or grid, as shown in FIG. 3a is particularly effective in modifying a divergence or convergence of an electron beam, i.e., a "focusing effect" or a "defocusing effect" is provided by a foil or grid lens having one foil or grid.

A foil or grid lens with two foils or grids on opposite sides of an electrode is particularly beneficial with respect to aberration correction, particularly spherical aberration correction, because a (first order) "focusing effect" caused by the electric field between the first foil or grid and the electrode can be shielded by the second foil or grid. At the same time, (negative) spherical aberrations are still applied by the electric field region between the two grids or foil, compensating (positive) spherical aberrations of the magnetic lens.

In some embodiments, an electric potential of 2 kV or more is applied between the electrode and the first foil or grid, particularly wherein the first foil or grid is electrically connected to a column or funnel of the electron beam apparatus. A corresponding electrical potential may also be applied between the second foil or grid and the electrode. In particular, the first and second grids may be connected to the same electric potential different from the potential of the electrode. The first and second grid may be connected electrically (and optionally also structurally) to a conductive housing or funnel of the electron beam apparatus. In some embodiments, an electrical potential of 2 kV may be applied between the electrode and the first and/or second foil or grid.

In some embodiments, the method further includes applying an electric acceleration field to accelerate the signal electron beam away from the sample to pass through the objective lens. The acceleration field can be generated by a retarding field device that decelerates the primary electron beam before impingement on the sample.

In light of the above, a plurality of embodiments are provided in the present disclosure, some of which are as follows:

Embodiment 1. An electron beam apparatus, comprising an electron source configured to generate a primary electron beam propagating along an optical axis, a sample stage configured to support a sample, an objective lens configured to focus the primary electron beam on the sample for causing an emission of a signal electron beam, and a foil or grid lens for influencing the signal electron beam, comprising an electrode that surrounds the optical axis and a first foil or grid adjacent to the electrode and perpendicular to the optical axis, the first foil or grid being substantially transparent to electrons, wherein a central opening configured to allow the primary beam to pass through the central opening is provided in the first foil or grid.

Embodiment 2. The electron beam apparatus of embodiment 1, wherein the central opening in the first foil or grid has a diameter of at least 100 μm, more particularly 200 μm or more, or even 300 μm or more.

Embodiment 3. The electron beam apparatus of any one of embodiments 1 through 2, wherein the first foil or grid is provided as a grid of wires with a plurality of grid holes having a maximum hole dimension below 100 μm, particularly below 50 μm. For example, the grid holes may be polygonal or honeycomb-shaped, with oppositely arranged sides of the polygon being spaced apart by 100 μm or less, particularly 50 μm or less.

Embodiment 4. The electron beam apparatus of any one of embodiments 1 through 3, wherein the first foil or grid is a carbon foil, particularly a graphene foil. In some embodiments, the first foil or grid may be a foil with a thickness of 0.1 μm or less.

Embodiment 5. The electron beam apparatus of any one of embodiments 1 through 4, wherein the first foil or grid provides an electron transparency of 50% or more, particularly 80% or more, more particularly 90% or more or even 95% or more.

Embodiment 6. The electron beam apparatus of any one of embodiments 1 through 5, further comprising a voltage supply configured to apply a potential difference of 2 keV or more, particularly 5 keV or more, between the electrode and the first foil or grid, and optionally also between the electrode and the second foil or grid.

Embodiment 7. The electron beam apparatus of any one of embodiments 1 through 6, wherein the first foil or grid surrounds the central opening and is configured for a passage of off-axial electrons of the signal electron beam through the first foil or grid, and optionally wherein a second foil or grid surrounds a second central opening and is configured for a passage of off-axial electrons of the signal electron beam through the second foil or grid. In particular, axial electrons of the signal electron pass through the central opening, whereas off-axial electrons of the signal electron beam penetrate through the respective foil or grid.

Embodiment 8. The electron beam apparatus of any one of embodiments 1 through 7, wherein the foil or grid lens is configured to influence the signal electron beam, particularly to modify a divergence or convergence of the signal electron beam and/or to correct aberrations of the signal electron beam, particularly while leaving the primary electron beam propagating through the central opening substantially uninfluenced. In particular, a divergence or convergence of the primary electron beam may not be substantially modified by the foil or grid lens, and a beam current of the primary electron beam can be maintained, because the primary electron beam does not impinge on a grid or foil material.

Embodiment 9. The electron beam apparatus of any one of embodiments 1 through 8, wherein the foil or grid lens further comprises a second foil or grid adjacent to the electrode and perpendicular to the optical axis, the second foil or grid being substantially transparent to electrons, wherein a central opening configured to allow the primary beam to pass therethrough is provided in the second foil or grid. In particular, the second foil or grid may have a structure and a configuration like the first foil or grid, and may be arranged on the other side of the electrode, such that the electrode is located between the first foil or grid and the second foil or grid, particularly in a symmetric setup. The first foil or grid and/or the second foil or grid may be made of a conductive material and/or may be set on the same electric potential different from an electric potential of the electrode. Optionally, a second electrode may be provided adjacent to the first (or the second) foil or grid on the other side of the first (or the second) foil or grid as compared to the electrode.

Embodiment 10. The electron beam apparatus of embodiment 9, wherein the foil or grid lens is configured to apply negative spherical aberrations and/or negative chromatic aberrations on the signal electron beam propagating therethrough, particularly to compensate positive spherical aberrations and/or positive chromatic aberrations of the signal electron beam that may be caused by the objective lens. In some embodiments, a divergence or convergence of the signal electron beam may remain substantially unmodified by the foil or grid lens, particularly if the foil or grid lens includes two foils or grids with the electrode arranged therebetween.

Embodiment 11. The electron beam apparatus of any one of embodiments 1 through 10, wherein the foil or grid lens is arranged in the vicinity of the objective lens, particularly wherein the objective lens is a magnetic lens and the foil or grid lens is arranged in the vicinity of a magnetic lens gap of the magnetic lens.

Embodiment 12. The electron beam apparatus of any one of embodiment 1 through 11, wherein the foil or grid lens is configured to compensate at least one of spherical and chromatic aberrations of the signal electron beam caused by the objective lens upon propagation of the signal electron beam through the objective lens.

Embodiment 13. The electron beam apparatus of any one of embodiments 1 through 12, further comprising a beam separator for separating the signal electron beam from the primary electron beam, and/or an energy analyzer for analyzing the signal electron beam.

Embodiment 14. A foil or grid lens for influencing an electron beam propagating through the foil or grid lens along an optical axis, comprising an electrode that surrounds the optical axis and a first foil or grid adjacent to the electrode and perpendicular to the optical axis, the first foil or grid being substantially transparent to electrons, wherein a central opening with a diameter of 100 μm or more is provided in the first foil or grid.

Embodiment 15. The foil or grid lens of embodiment 14, wherein the central opening is configured to allow a primary electron beam to pass therethrough, and the substantially electron-transparent first foil or grid is configured for being penetrated by off-axial electrons of a signal electron beam for influencing the signal electron beam while maintaining the primary electron beam substantially unmodified.

Embodiment 16. The foil or grid lens of any one of embodiments 14 through 15, further comprising a second foil or grid adjacent to the electrode and perpendicular to the optical axis, the second foil or grid being substantially transparent to electrons, wherein a central opening with a diameter of 100 μm or more is provided in the second foil or grid. The second foil or grid may be made of a conductive material.

Embodiment 17. A method of operating an electron beam apparatus having a foil or grid lens, the foil or grid lens having a first foil or grid arranged adjacent to an electrode, the method comprising applying an electrical potential between the first foil or grid and the electrode, directing a primary electron beam along an optical axis through a central opening provided in the first foil or grid, and focusing, using an objective lens, the primary electron beam on a sample for causing emission of a signal electron beam that propagates through the objective lens and through the foil or grid lens in an opposite direction as compared to the primary electron beam, wherein off-axial electrons of the signal electron beam propagate through the first foil or grid that surrounds the central opening and is substantially transparent to electrons.

Embodiment 18. The method of embodiment 17, wherein the foil or grid lens further comprises a second foil or grid adjacent to the electrode and perpendicular to the optical axis, the first foil or grid and the second foil or grid being arranged on opposite sides of the electrode, wherein the primary beam propagates through a central opening provided in the second foil or grid, and the off-axial electrons of the signal electron beam propagate through the second foil or grid that surrounds said central opening provided in the second foil or grid.

Embodiment 19. The method of any one of embodiments 17 through 18, wherein the primary electron beam is substantially uninfluenced by the foil or grid lens, and/or the foil or grid lens is configured to correct aberrations of the signal electron beam caused by the objective lens.

Embodiment 20. The method of any one of embodiments 17 through 19, further comprising one or both of correcting at least one of spherical and chromatic aberration of the signal electron beam with the foil or grid lens and modifying a divergence or convergence of the signal electron beam to provide an essentially parallel signal electron beam.

Embodiment 21. The method of any one of embodiments 17 through 20, wherein an electric potential of 2 kV or more is applied between the electrode and the first grid or foil, particularly, wherein the first grid or foil is electrically connected to a column or funnel of the electron beam apparatus.

Embodiment 22. The method of any one of embodiments 17 through 21, further comprising applying an electric acceleration field to accelerate the signal electron beam away from the sample to pass through the objective lens.

This written description uses examples to disclose the disclosure, including the best mode, and also to enable any person skilled in the art to practice the described subject-matter, including making and using any devices or systems and performing any incorporated methods. While various specific embodiments have been disclosed in the foregoing, mutually non-exclusive features of the embodiments described above may be combined with each other. The patentable scope is defined by the claims, and other examples are intended to be within the scope of the claims if they have structural elements that do not differ from the literal language of the claims, or if they include equivalent structural elements with insubstantial differences from the literal language of the claims.

What is claimed is:

1. An electron beam apparatus, comprising:
an electron source configured to generate a primary electron beam propagating along an optical axis;
a sample stage configured to support a sample;
an objective lens configured to focus the primary electron beam on the sample for causing an emission of a signal electron beam;
a foil or grid lens for influencing the signal electron beam, comprising:
an electrode that surrounds the optical axis; and
a first foil or grid adjacent to the electrode and perpendicular to the optical axis, the first foil or grid being substantially transparent to electrons, wherein a central opening configured to allow the primary electron beam to pass through the central opening is provided in the first foil or grid; and
a voltage supply configured to apply a potential difference of 2 keV or more between the electrode and the first foil or grid.

2. The electron beam apparatus of claim 1, wherein the central opening in the first foil or grid has a diameter of at least 100 μm.

3. The electron beam apparatus of claim 1, wherein the first foil or grid is provided as a grid of wires with a plurality of grid holes having a maximum hole dimension below 100 μm, particularly below 50 μm.

4. The electron beam apparatus of claim 1, wherein the first foil or grid is a carbon foil with a thickness of 0.1 μm or less.

5. The electron beam apparatus of claim 1, wherein the first foil or grid provides an electron transparency of 80% or more.

6. The electron beam apparatus of claim 1, wherein the first foil or grid surrounds the central opening and is configured for a passage of off-axial electrons of the signal electron beam through the first foil or grid.

7. The electron beam apparatus of claim 1, wherein the foil or grid lens is configured to at least one of modify a divergence or convergence of the signal electron beam and correct aberrations of the signal electron beam, while leaving the primary electron beam propagating through the central opening substantially uninfluenced.

8. The electron beam apparatus of claim 1, wherein the objective lens is a magnetic lens and the foil or grid lens is arranged in vicinity of a magnetic lens gap of the magnetic lens.

9. The electron beam apparatus of claim 1, wherein the foil or grid lens is configured to compensate at least one of spherical and chromatic aberrations of the signal electron beam caused by the objective lens upon propagation of the signal electron beam through the objective lens.

10. The electron beam apparatus of claim 9, further comprising:
a beam separator for separating the signal electron beam from the primary electron beam, and
an energy analyzer for analyzing the signal electron beam.

11. A foil or grid lens for influencing an electron beam propagating through the foil or grid lens along an optical axis, comprising:
an electrode that surrounds the optical axis; and
a first foil or grid adjacent to the electrode and perpendicular to the optical axis, the first foil or grid being substantially transparent to electrons, wherein a central opening with a diameter of 100 μm or more is provided in the first foil or grid.

12. The foil or grid lens of claim 11, wherein the central opening is configured to allow a primary electron beam to pass therethrough, and the first foil or grid is configured for a passage of off-axial electrons of a signal electron beam therethrough for influencing the signal electron beam while maintaining the primary electron beam substantially unmodified.

13. The foil or grid lens of claim 11, further comprising a second foil or grid of conductive material adjacent to the electrode and perpendicular to the optical axis, the second foil or grid being substantially transparent to electrons, wherein a central opening with a diameter of 100 μm or more is provided in the second foil or grid.

14. A method of operating an electron beam apparatus having a foil or grid lens, the foil or grid lens having a first foil or grid arranged adjacent to an electrode, the method comprising:
applying an electrical potential between the first foil or grid and the electrode;
directing a primary electron beam along an optical axis through a central opening provided in the first foil or grid; and
focusing, using an objective lens, the primary electron beam on a sample for causing emission of a signal electron beam that propagates through the objective lens and through the foil or grid lens in an opposite direction as compared to the primary electron beam;
wherein off-axial electrons of the signal electron beam propagate through the first foil or grid that surrounds the central opening and is substantially transparent to electrons; and wherein an electric potential of 2 kV or more is applied between the electrode and the first grid or foil.

15. The method of claim 14, wherein the foil or grid lens further comprises a second foil or grid adjacent to the electrode and perpendicular to the optical axis, the first foil or grid and the second foil or grid being arranged on opposite sides of the electrode, wherein the primary electron beam propagates through a central opening provided in the second foil or grid; and the off-axial electrons of the signal electron beam propagate through the second foil or grid that surrounds said central opening provided in the second foil or grid.

16. The method of claim 15, wherein the primary electron beam is substantially uninfluenced by the foil or grid lens, and the foil or grid lens is configured to correct aberrations of the signal electron beam caused by the objective lens.

17. The method of claim 14, further comprising one or both of the following:

correcting at least one of spherical and chromatic aberration of the signal electron beam with the foil or grid lens; and modifying a divergence or convergence of the signal electron beam with the foil or grid lens.

18. The method of claim 14, further comprising:

applying an electric acceleration field to accelerate the signal electron beam away from the sample to pass through the objective lens.

19. An electron beam apparatus, comprising:

an electron source configured to generate a primary electron beam propagating along an optical axis;

a sample stage configured to support a sample;

an objective lens configured to focus the primary electron beam on the sample for causing an emission of a signal electron beam; and a foil or grid lens for influencing the signal electron beam, comprising:

an electrode that surrounds the optical axis;

a first foil or grid adjacent to the electrode and perpendicular to the optical axis, the first foil or grid being substantially transparent to electrons, wherein a central opening configured to allow the primary electron beam to pass through the central opening is provided in the first foil or grid; and a second foil or grid adjacent to the electrode and perpendicular to the optical axis, the second foil or grid being substantially transparent to electrons, wherein a central opening configured to allow the primary electron beam to pass therethrough is provided in the second foil or grid;

wherein the foil or grid lens is configured to apply at least one of negative spherical aberrations and negative chromatic aberrations on the signal electron beam.

* * * * *